United States Patent
Baeckler et al.

(10) Patent No.: US 7,634,705 B1
(45) Date of Patent: Dec. 15, 2009

(54) METHODS AND APPARATUS FOR ERROR CHECKING CODE DECOMPOSITION

(75) Inventors: Gregg William Baeckler, San Jose, CA (US); Babette Van Antwerpen, Mountain View, CA (US)

(73) Assignee: Altera Corporation, San Jose, CA (US)

( * ) Notice: Subject to any disclaimer, the term of this patent is extended or adjusted under 35 U.S.C. 154(b) by 659 days.

(21) Appl. No.: 11/403,342

(22) Filed: Apr. 12, 2006

(51) Int. Cl.
  *H03M 13/00* (2006.01)
(52) U.S. Cl. .................. 714/758; 714/759; 714/781
(58) Field of Classification Search .................. 714/758, 714/759, 781
  See application file for complete search history.

(56) References Cited

U.S. PATENT DOCUMENTS 6,519,738 B1 * 2/2003 Derby .................. 714/781
2003/0056158 A1 * 3/2003 Yue .................. 714/704

OTHER PUBLICATIONS

NB9406267:'Technique for Cyclic Redundancy Check Modification Useful in Certain Data Networks.'IBM Technical Disclosure Bulletin, Jun. 1994, US;vol. No. 37 ,Issue No. 6B.*

NN8805458:'Method to Provide Software Calculation of a 32-Bit Frame Check Sequence, a Byte at a Time,'IBM Technical Disclosure Bulletin, May 1988, US, vol. No. 30, Issue No. 12.*

Gurindar Singh Sohi, "High-Bandwidth Interleaved Memories for Vector Processors—A Simulation Study", IEEE Transactions on Computers, vol. 42, No. 1, Jan. 1993.

Terry Ritter, "The Great CRC Mystery", Dr. Dobb's Journal of Software Tools, Feb. 11(2); 26-34, 76:83, downloaded Apr. 24, 2007, 1986.

* cited by examiner

*Primary Examiner*—Guy J Lamarre
(74) *Attorney, Agent, or Firm*—Weaver Austin Villeneuve & Sampson LLP

(57) ABSTRACT

Methods and apparatus are provided for more efficiently implementing error checking code circuitry on a programmable chip. In one example, Cyclic Redundancy Check (CRC) exclusive OR (XOR) circuitry is decomposed to allow efficient implementation on lookup tables (LUTs) of various sizes on a device. XOR cancellation factoring is used to break up wide CRC XORs into blocks that fit in various LUTs while maintaining focus on minimizing logic depth and logic area. Simulated annealing is used to further reduce logic area cost.

28 Claims, 8 Drawing Sheets

METHODS AND APPARATUS FOR ERROR CHECKING CODE DECOMPOSITION

BACKGROUND OF THE INVENTION

1. Field of the Invention

The present invention relates to cyclic redundancy checks (CRCs). More specifically, the techniques of the present invention provide mechanisms for efficiently performing cyclic redundancy checks on programmable chips.

2. Description of Related Art

Cyclic redundancy checks (CRCs) are used in many communication and storage applications to detect data corruption. In a typical example, a message (M) is divided by a polynomial (P) known to both a sender and a receiver. The remainder (R) is transmitted with the message (M) to the receiver. The receiver uses the remainder (R) to verify that the message (M) has not been corrupted. R is referred to also as the Frame Check Sequence (FCS) or as a CRC. Although it is possible that different messages can give the same remainder R when divided by a polynomial (P), CRC computations have been highly effective, as the probability that corrupted data can pass a 32 bit CRC (CRC32) check is remote.

Galois field division is often used to determine R. Galois field division is implemented using shift registers and exclusive OR (XOR) gates on a programmable chip. In a simplified example, division can be performed by performing one XOR, bit shifting, performing another XOR, bit shifting, etc. However, to perform a CRC of 8 data bits, 8 clocks cycles would be required. To increase efficiency, it is well recognized that the bits in R or in a CRC can be calculated by performing XOR computations of various data and polynomial bits simultaneously.

However, performing these computations can be inefficient on programmable chips. That is, performing these computations may require many levels of logic or require a large amount of logic. Consequently, the techniques of the present invention provide efficient mechanisms for calculating CRCs on programmable chips.

SUMMARY OF THE INVENTION

Methods and apparatus are provided for more efficiently implementing error checking code circuitry on a programmable chip. In one example, Cyclic Redundancy Check (CRC) exclusive OR (XOR) circuitry is decomposed to allow efficient implementation on lookup tables (LUTs) of various sizes on a device. XOR cancellation factoring is used to break up wide CRC XORs into blocks that fit in various LUTs while maintaining focus on minimizing logic depth and logic area. Simulated annealing is used to further reduce logic area cost.

In one embodiment, a technique for decomposition of a circuit for implementation on a programmable chip is provided. A data width, a cyclic redundancy check (CRC) width, and a polynomial associated with the CRC width are provided. CRC output bits are expressed as wide Exclusive OR (XOR) operations. Factoring with cancellation is performed to break the wide XOR operations into XOR operations that fit in programmable chip lookup tables (LUTs). Performing factoring with cancellation includes determining costs associated with proposed extractions.

In another embodiment, a system for performing decomposition of a circuit for implementation on a programmable chip is provided. The system include an interface and a processor. The interface is operable to provide a data width, a cyclic redundancy check (CRC) width, and a polynomial associated with the CRC width. The processor is operable to express CRC output bits as wide Exclusive OR (XOR) operations and perform factoring with cancellation to break the wide XOR operations into XOR operations that fit in programmable chip lookup tables (LUTs). Performing factoring with cancellation includes determining costs associated with proposed extractions.

These and other features and advantages of the present invention will be presented in more detail in the following specification of the invention and the accompanying figures, which illustrate by way of example the principles of the invention.

BRIEF DESCRIPTION OF THE DRAWINGS

The invention may best be understood by reference to the following description taken in conjunction with the accompanying drawings, which illustrate specific embodiments of the present invention.

DETAILED DESCRIPTION OF SPECIFIC EMBODIMENTS

Figure 1:
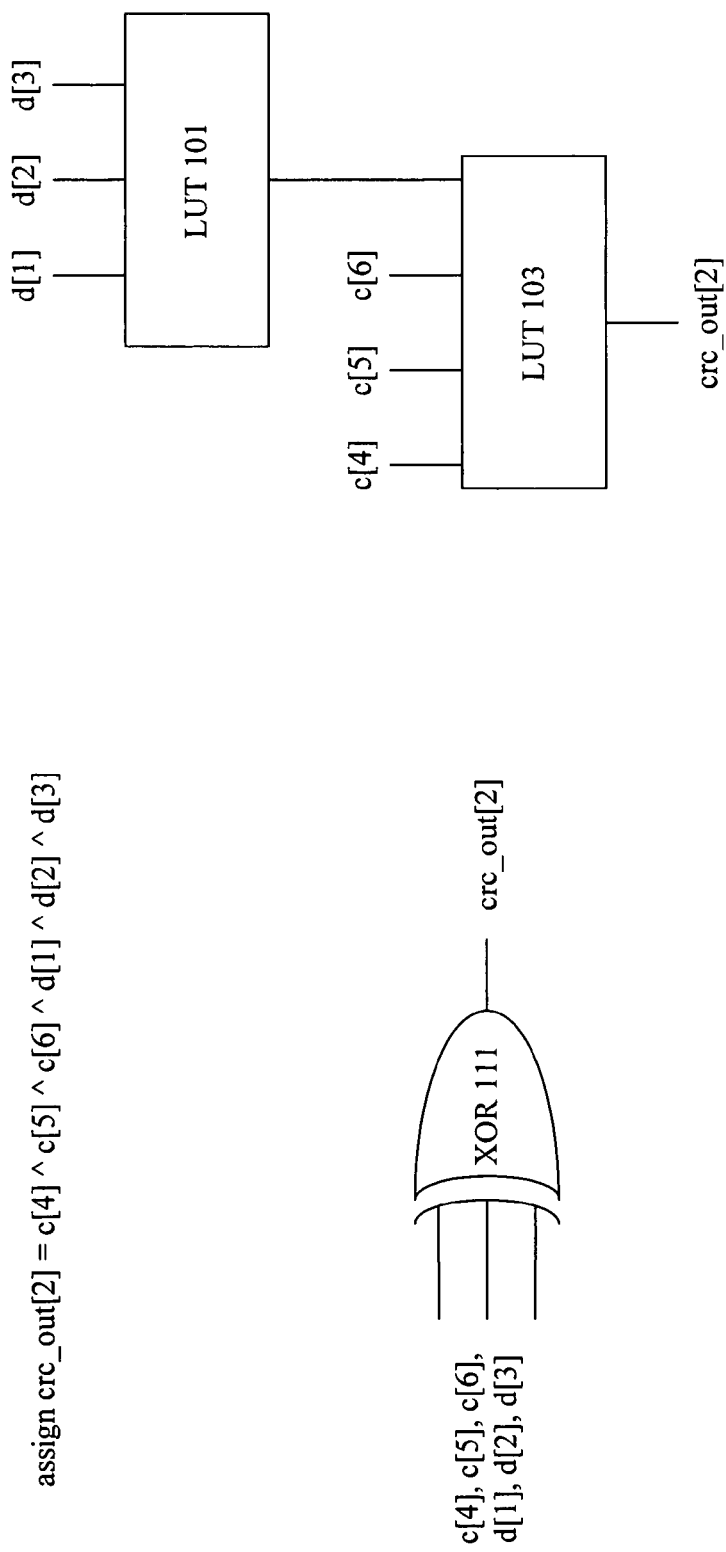
FIG. 1 is a diagrammatic representation showing an exclusive OR (XOR) gate implemented using lookup tables (LUTs).

Reference will now be made in detail to some specific embodiments of the invention including the best modes contemplated by the inventors for carrying out the invention. Examples of these specific embodiments are illustrated in the accompanying drawings. While the invention is described in conjunction with these specific embodiments, it will be understood that it is not intended to limit the invention to the described embodiments. On the contrary, it is intended to cover alternatives, modifications, and equivalents as may be included within the spirit and scope of the invention as defined by the appended claims.

For example, the techniques of the present invention will be described in the context of cyclic redundancy checks or cyclic redundancy codes. However, it should be noted that the techniques of the present invention can be applied to a variety of different error checking and error correcting codes and mechanisms. In the following description, numerous specific details are set forth in order to provide a thorough understanding of the present invention. The present invention may be practiced without some or all of these specific details. In other instances, well known process operations have not been described in detail in order not to unnecessarily obscure the present invention.

Furthermore, techniques and mechanisms of the present invention will sometimes be described in singular form for clarity. However, it should be noted that some embodiments can include multiple iterations of a technique or multiple instantiations of a mechanism unless noted otherwise. For example, a processor is used in a variety of contexts. However, it will be appreciated that multiple processors can also be used while remaining within the scope of the present invention.

Cyclic redundancy checks are used in many networking and data storage applications to detect transmission errors and data corruption. In a simplified implementation, a data stream or message (M) is divided by a polynomial (P) known to both a sender and a receiver. The remainder (R) is stored and/or transmitted with the message to allow later verification that M was not corrupted. R is also referred to as a Frame Check Sequence (FCS) or a CRC. To allow efficient division of M by R, Galois field division is used. Galois field division is implemented using shift registers and Exclusive OR (XOR) gates in a variety of hardware devices. Division can be performed by performing an XOR, bit shifting, performing another XOR, bit shifting, etc. To increase efficiency, it is well recognized that the bits in R or in a CRC can be calculated by performing XOR computations of various data and polynomial bits simultaneously.

In one example, a divisor is three bits (e.g. 101) and a dividend is six bits (e.g. 111001). In simplified polynomial long division, it is determined at each stage of division whether the leading bit of the current three bits is 0 or 1. If it is 0, a 0 is placed in the quotient and an XOR operation is performed with the current bits and 000. If the leading bit of the current three bits is 1, a 1 is placed in the quotient and an XOR is performed with the current bits and the divisor. It is well recognized that computing remainders is even simpler because the quotient is not needed. In a simplified example, a sequence of six bit XORs can be performed with bit shifting after each XOR.

It is well known that remainder or CRC output bits can be determined by performing XOR operations on various polynomial and data bits. For example, where c[0]-c[7] represent an 8 bit polynomial and d[0]-d[3] represent 4 bits of data, the remainders can be expressed in the following manner:

crc_out[0]=c[4]^d[3];

crc_out[1]=c[4]^c[5]^d[2]^d[3];

crc_out[2]=c[4]^c[5]^c[6]^d[1]^d[2]^d[3];

crc_out[3]=c[5]^c[6]^c[7]^d[0]^d[1]^d[2];

crc_out[4]=c[0]^c[6]^c[7]^d[0]^d[1];

crc_out[5]=c[1]^c[7]^d[0];

crc_out[6]=c[2];

crc_out[7]=c[3];

FIG. 1 is a diagrammatic representation showing CRC decomposition or factoring for implementation on programmable chips. Programmable chips use different types of resources that can be allocated to implement a programmable chip. In one example, the programmable chip uses logic elements for implementing each of the various components on the programmable chip. Some programmable chips also include preconfigured logic blocks as resources that can be allocated in different manners to run various subroutines.

Logic elements typically can be implemented using components such as antifuses, static RAM, and EPROMS. Any mechanism on a programmable chip that performs an operation on a given number of input lines to provide one or more outputs based on information programmed is herein referred to as a logic element. Some logic elements are implemented as combinations of look up tables and switches for performing Boolean operations on input lines. In one example, a logic element includes a 16-bit SRAM lookup table (LUT) that can implement an arbitrary 4-input logic function, circuitry that forms a fast carry chain and a fast cascade chain, a register and preset/reset logic for the register. In other examples, a logic element allows implementation of other fixed sized input logic functions.

Because programmable chips implement logic using LUTs with limited width, wide XORs such as c[4]^c[5]^c[6]^d[1]^d[2]^d[3] need to be decomposed or factored in order to fit in a single LUT. An XOR function 111 is implemented using multiple LUTs 101 and 103. According to various embodiments, three input LUT 101 takes inputs d[1], d[2], d[3] and provide an output to LUT 103. Four input LUT 103 takes inputs c[4], c[5], c[6], and the output of LUT 101 and provides crc_out[2]. Typical CRC XORs do not fit in a single LUT. For example, a CRC32 with 32 bit data uses XORs with up to 34 inputs. A 128 bit data sequence uses an 89 input XOR.

Figure 2C:
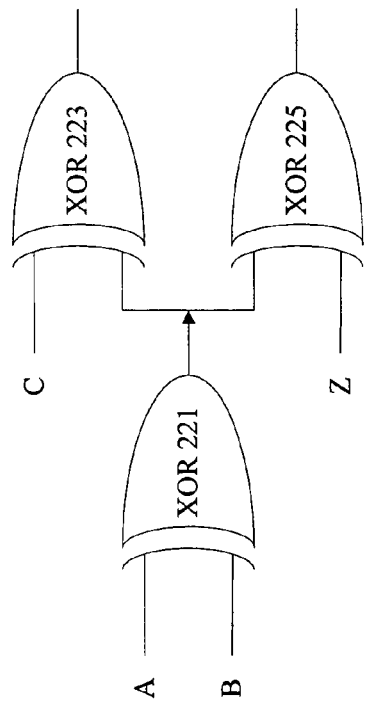
FIGS. 2A-2C are diagrammatic representations showing XOR gates and decomposition.
Figure 2B:
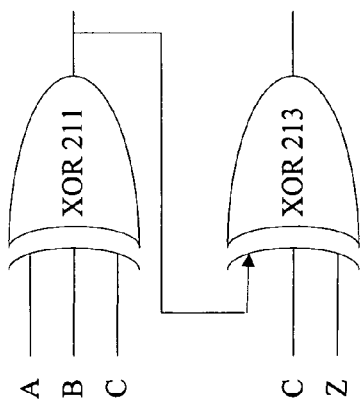
Figure 2A:
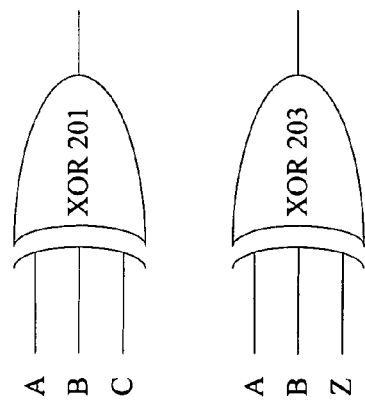

FIGS. 2A-2C are diagrammatic representations showing XOR decomposition. FIG. 2A shows XOR gate 201 with inputs A, B, and C and XOR gate 203 with inputs A, B, and Z. The XORs are in flat and unfactored form. FIG. 2B shows XOR gate 211 with inputs A, B and C and XOR gate 213 with inputs C, Z, and the output of XOR gate 211. The C signal in XOR gate 211 is canceled when XOR gate 213 takes the C signal again as an input. That is, A^B^C^C^Z is equivalent to A^B^Z. Cancellation increases the number of factoring and decomposition possibilities exponentially. Consequently, many conventional implementations do not use cancellation when factoring. FIG. 2C shows XOR gate 221 with inputs A and B. The output of XOR gate 221 is provided to XOR gate 223 and to XOR gate 225. XOR gate 223 takes as inputs C and the output of XOR gate 221. XOR gate 225 takes as inputs Z and the output of XOR gate 221.

Figure 3B:
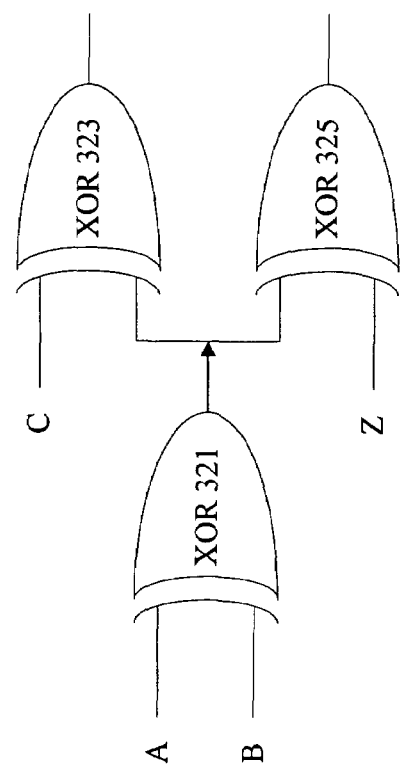
FIGS. 3A-3B are diagrammatic representations showing XOR gates and decomposition.
Figure 3A:
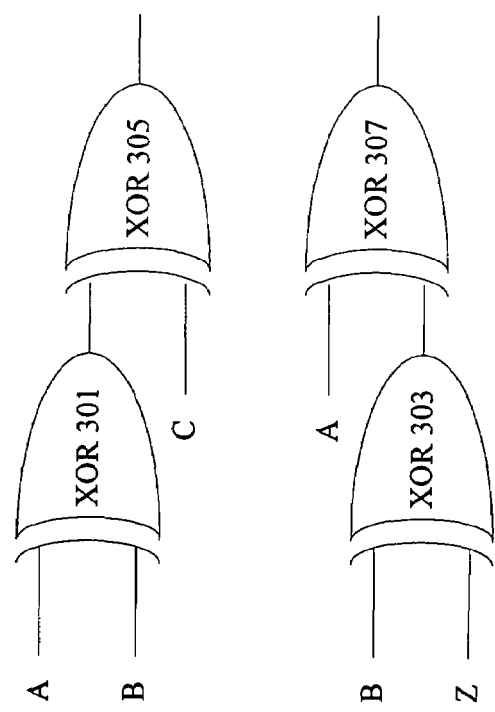

FIGS. 3A and 3B are diagrammatic representations showing factoring. According to various embodiments, it is important that the factoring algorithm make good reuse of extracted functions to minimize the number of LUTs and the number of levels to implement the resulting CRC system. Minimizing the number of LUTs improves resource usage and minimizing the number of levels increases processing speed. In most implementations, it is desirable to increase processing speed even at the expense of using more area on a device.

FIG. 3A shows XOR gate 301 with inputs A and B providing an output to XOR gate 305. XOR gate 305 takes as inputs C and the output of XOR gate 301. XOR gate 303 takes as inputs Z and B and provides an output to XOR gate 307. XOR gate 307 takes as inputs A and the output of XOR gate 301. Four XOR gates are used to implement a two level system. FIG. 3B shows XOR gate 321 with inputs A and B. The output of XOR gate 321 is provided to XOR gate 323 and to XOR gate 325. XOR gate 323 takes as inputs C and the output of XOR gate 321. XOR gate 325 takes as inputs Z and the output of XOR gate 321. The circuits shown in FIGS. 3A and 3B are equivalent, but the circuit shown in FIG. 3A uses 4 cells while the circuit shown in FIG. 3B uses only 3 cells.

Conventional synthesis algorithms do a poor job of factoring CRCs. Conventional algorithms are generally restricted to non-cancellation factoring because it is believed that the search space with cancellation is unmanageable. Attempts at performing cancellation factoring exhibit run time problems because the number of possible extractions increases exponentially with the size of the CRC. Some attempts have been made to do XOR cancellation factoring but not as a first choice.

In one example, non-cancellation factoring is performed for an eight bit CRC with 4 data bits.

crc_out[0]=c[4]^d[3];

crc_out[1]=c[4]^c[5]^d[2]^d[3];

crc_out[2]=c[4]^c[5]^c[6]^d[1]^d[2]^d[3];

crc_out[3]=c[5]^c[6]^c[7]^d[0]^d[1]^d[2];

crc_out[4]=c[0]^c[6]^c[7]^d[0]^d[1];

crc_out[5]=c[1]^c[7]^d[0];

crc_out[6]=c[2];

crc_out[7]=c[3];

To determine crc_out[2] and crc_out[3], a six input logic element or logic cell would be required. In some cases, a programmable chip could be configured with a six input logic element. However, some programmable chips may only have five inputs LUTs or 5-LUTs, so both crc_out[2] and crc_out[3] would have to be factored. A good algorithm would detect that crc_out[2] has a superset of the terms used by crc_out[1] and change crc_out[2] as follows:

crc_out[2]=c[6]^d[1]^crc_out[1];

This allows reuse of existing circuitry. The crc_out[3] component also has to be factored. One possible solution would be to create a new gate as follows:

helper=c[6]^c[7]^d[0]^d[1]

The helper gate is the largest subset of crc_out[3] that can be reused by another gate crc_out[4]. Consequently, crc_out[3] and crc_out[4] become the following:

crc_out[3]=c[5]^d[2]^helper;

crc_out[4]=c[0]^helper;

The resulting solution can be implemented using nine five input LUTs. That is, eight five inputs gates are needed plus the helper gate.

CRC XORs have many non-cancellation extract candidates which bait conventional algorithms into making many suboptimal extractions. Conventional algorithms result in depth increases with less area savings than would be desirable. According to various embodiments, it is recognized that cancellation factoring is particularly beneficial in the context of CRCs because of the data characteristics associated with the various XOR operations. The techniques of the present invention provide mechanisms for selecting extraction candidates and performing cancellation factoring.

According to various embodiments, cancellation factoring is performed for an eight bit CRC with 4 data bits.

crc_out[0]=c[4]^d[3];

crc_out[1]=c[4]^c[5]^d[2]^d[3];

crc_out[2]=c[4]^c[5]^c[6]^d[1]^d[2]^d[3];

crc_out[3]=c[5]^c[6]^c[7]^d[0]^d[1]^d[2];

crc_out[4]=c[0]^c[6]^c[7]^d[0]^d[1];

crc_out[5]=c[1]^c[7]^d[0];

crc_out[6]=c[2];

crc_out[7]=c[3];

The equation associated with crc_out[2] has a superset of the terms used by crc_out[1] and crc_out[2] can be changed as follows:

crc_out[2]=c[6]^d[1]^crc_out[1];

This allows reuse of existing circuitry. The crc_out[3] component also has to be factored. With factoring, crc_out[3] can be factored more efficiently using cancellation than using typically available techniques. It is recognized that crc_out[4] has 4 terms used by crc_out[3] and one additional term. According to various embodiments, crc_out[4] can be extracted and the additional term canceled to produce the following:

crc_out[3]=c[5]^crc_out[4]^c[0]^d[2];

With the use of cancellation, the helper gate is no longer required. The resulting solution can be implemented using eight five input LUTs.

According to various embodiments, the techniques of the present invention generate a factored CRC for LUT implementation on a programmable chip. Area cost is reduced and LUT depth is minimized. The number of LUTs between any input and output does not need to exceed log (width of the widest XOR) rounded to the next highest integer, where the log is taken with a base equal to the maximum LUT size. CRCs are described as wide XORs. Factoring with cancellation is used to form a depth optimal and relatively high quality area initial solution. Simulated annealing is used to tune the solution for further are improvements. Results are provided in a programmable chip specific HDL formal.

Figure 4:
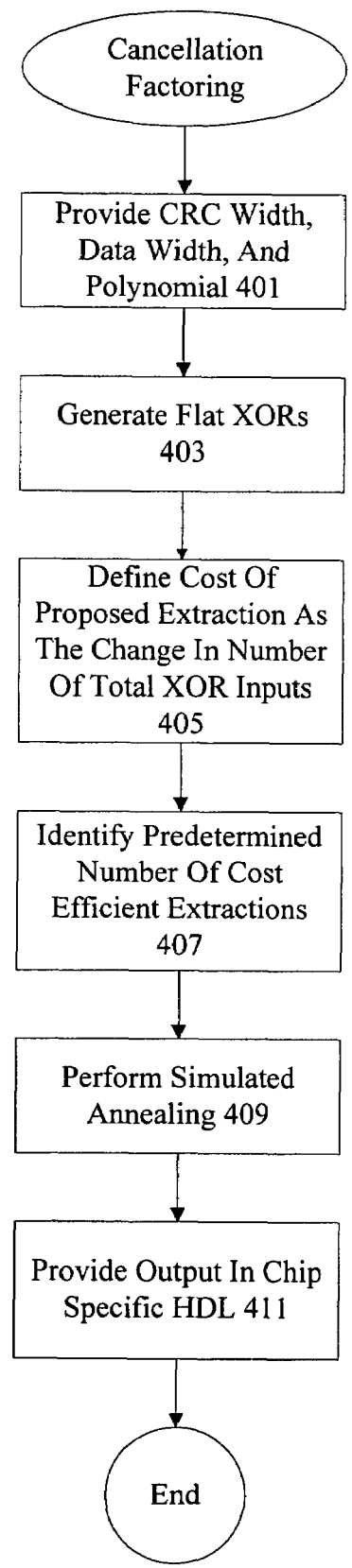
FIG. 4 is a process flow diagram depicting cancellation factoring.

FIG. 4 is a flow process diagram showing one technique for perform cancellation factoring. At 401, parameters such as CRC width, data width, and polynomial value are provided. Typical CRC widths are 5, 8, 12, 16, 32, and 64 bits. Typical data widths are 32, 64, and 128 bits. According to various embodiments, standard polynomial values are provided depending on CRC width. For example, CRC32 has a polynomial value 0x04c11db7. CRC16 uses a polynomial value 0x1021. A variety of polynomial values can be used. At 403, flat XORs are generated. A variety of conventionally available tools can be used to generate flat XORs. One example of a flat CRC HDL generator is the Easics CRC Tool for Generation of synthesizable CRC functions in VHDL, available from Easics Corporation of Leuven, Belgium.

At 405, the cost of a proposed extraction is defined as the change in the number of total XOR inputs for the system. For example, if an original system includes a first XOR gate with inputs A^B^C and a second XOR gate with inputs A^B^Z, a proposed extraction could be A^B. The cost of the proposed extraction is 0, because two wires are removed from the first XOR gate, two wires are removed from the second XOR gate, but two new wires are added to a new helper gate and two new inputs are needed to deliver the helper gate outputs. This extraction would be neutral. According to various embodiments, a good extraction has a negative cost and a bad extraction has a positive cost. It is recognized that the more gates that use an extracted gate, the better chance it has to have a negative cost.

At 407, a predetermined number of cost efficient extractions are determined. According to various embodiments, all possible combinations of inputs signals up to the supported LUT size are evaluated as possible extraction candidates. Although this is time consuming, it is recognized that it is feasible as a one time activity to build a RC core. It should be noted that extractions may not appear exactly on any of the gates that use it, because cancellations may be required. Typical implementations only considered possibilities that did not require cancellations.

In one embodiment, each of all possible extractions are evaluated for each CRC output bit on each pass. The best combination of extractions are identified and the process is repeated. The cost for each extraction is compared to the costs of the other extractions and a predetermined number of the most efficient extractions are maintained. In one example, the best 1000 or best 3000 extractions are maintained. The best 1000 extractions, for example, are executed as appropriate rather than reevaluating cost completely on each pass. According to various embodiments, CRC output bits that do not require more than one LUT are pruned to provide for a more reasonable search space.

In some examples, cancellation factoring is applied until all gates are small enough to implement in programmable chip LUTs. Optimal depth is maintained by allocating a roughly equal number of helper gates at each allowable level, and repeating the process for each level. According to various embodiments, the solution is further optimized by using simulated annealing at 409 to explore the solution space.

Simulated annealing is a technique for exploring a solution space for optimization purposes through a series of moves with forced convergence. Solution quality is evaluated using a cost function. According to various embodiments, the cost function is the area of the solution in LUTs. Minor adjustments are added to reflect LUT packability and wire cost for specific chip architectures. The cost can be easily customized for different architectures. The output after simulated annealing is provided in a chip specific HDL such as VHDL or Verilog format.

Figure 5:
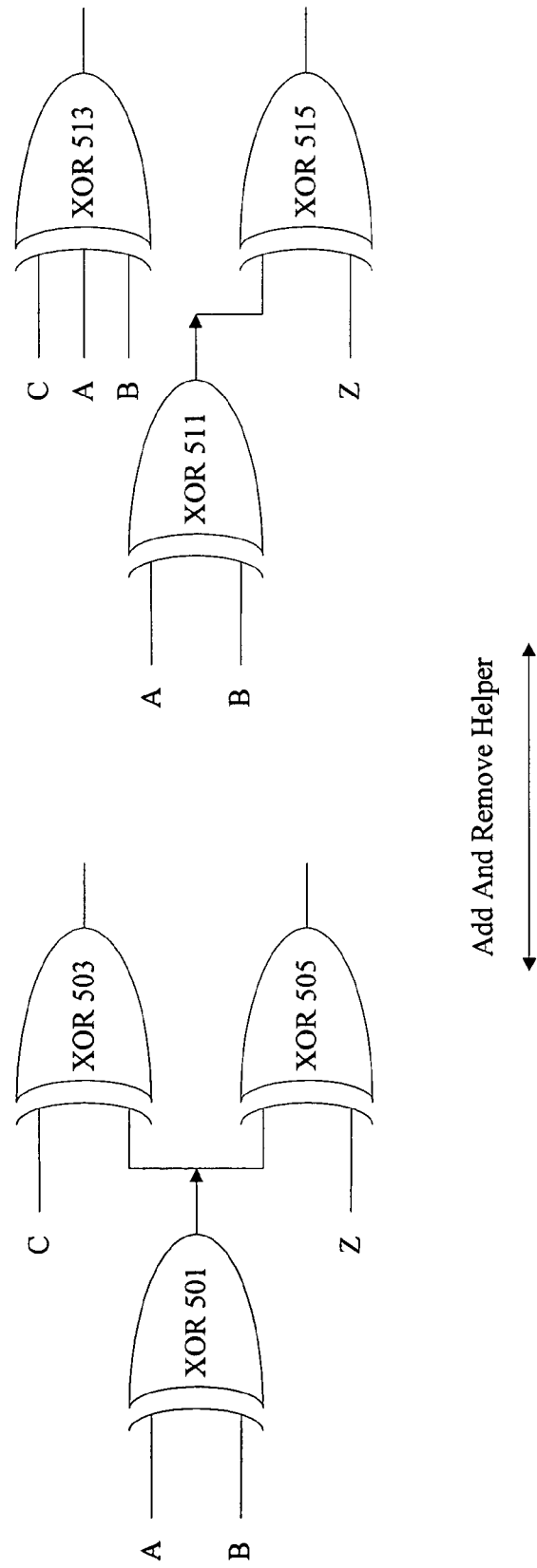
FIG. 5 is a diagrammatic representation showing simulated annealing.

According to various embodiments, several types of annealing moves are used although many types of moves are possible. FIG. 5 is a diagrammatic representation showing one annealing technique. The use of a helper gate is toggled and evaluated using a cost function. Helper XOR gate 501 takes inputs A and B and provides an output to XOR gates 503 and 505. XOR gate 503 takes as input C and the output of helper gate 501. XOR gate 505 takes as input Z and the output of helper gate 501. Annealing is used to toggle use of a helper gate by an individual XOR gate. Helper XOR gate 511 takes inputs A and B and provides an output to XOR gate 515. XOR gate 513 no longer takes the output of a helper gate and instead uses inputs A, B, and C. XOR gate 515 continues to use the output of helper gate 511 and also takes input Z.

Figure 6:
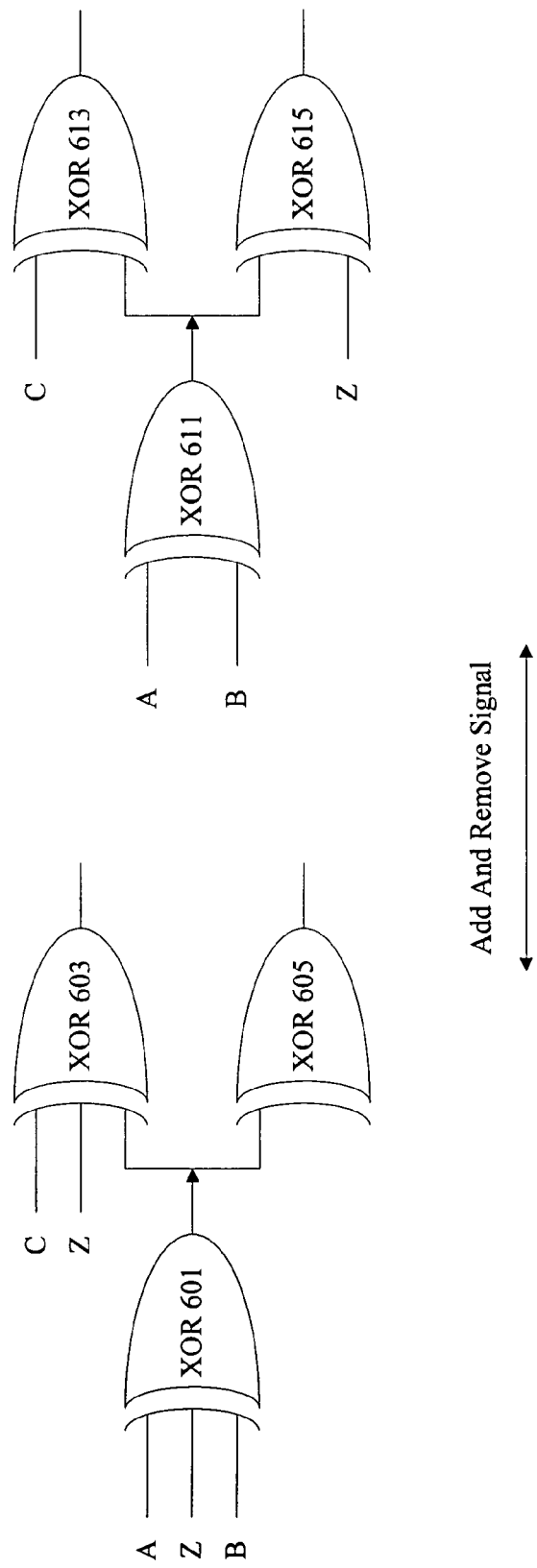
FIG. 6 is a diagrammatic representation showing simulated annealing.

FIG. 6 is a diagrammatic representation showing another annealing technique. A signal is added or removed from a helper gate and necessary cancellation inputs are added or removed to maintain functional equivalence. Helper XOR gate 601 takes inputs A, B, and Z and provides an output to XOR gates 603 and 605. XOR gate takes inputs C and Z along with the output of XOR gate 601. A signal Z is removed from XOR gate 601 to evaluate a cost function. Helper XOR gate 611 takes inputs A and B and provides an output to XOR gates 613 and 615. Signal Z is removed from XOR gate 613, which now takes as input C and the output of XOR gate 611. XOR gate 615 takes an added input Z and the output of XOR gate 611. In one example, an annealing process uses 100 rounds or 200 moves each. Higher numbers would result in higher runtime and possibly lower area cost. After each round, the cost is evaluated and saved if better than the best previously encountered solution.

Figure 7:
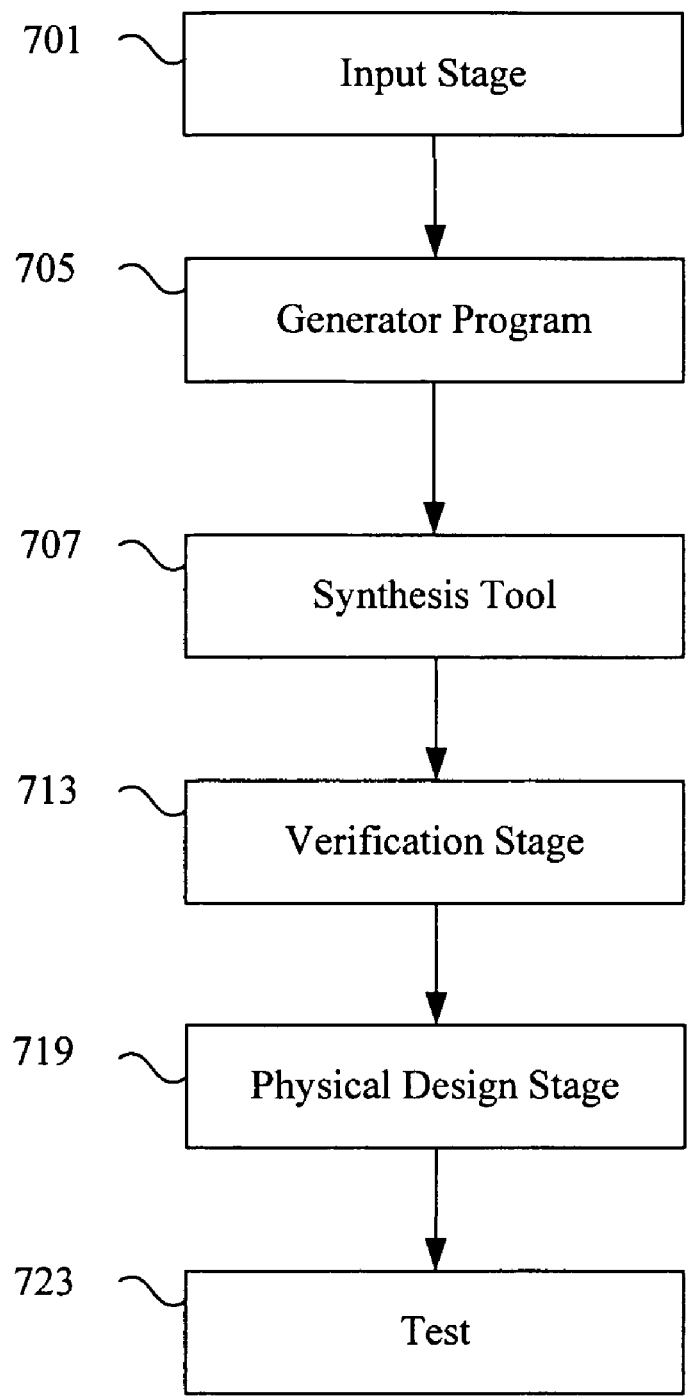
FIG. 7 is a diagrammatic representation showing a technique for implementing the programmable chip.

FIG. 7 is a diagrammatic representation showing implementation of a programmable chip. According to various embodiments, an input stage 701 receives selection information typically from a user for logic to be implemented on an electronic device. A generator program 705 creates a logic description and provides the logic description along with other customized logic to any of a variety of synthesis tools, place and route programs, and logic configuration tools to allow a logic description to be implemented on an electronic device.

The input stage 701 may be a graphical user interface using wizards for allowing efficient or convenient entry of information. The input stage may also be a text interface or a program reading a data file such as a spreadsheet, database table, or schematic to acquire selection information. The input stage 701 produces an output containing information about the various modules selected.

In typical implementations, the generator program 705 can identify the selections and generate a logic description with information for implementing the various modules. The generator program 705 can be a Perl script creating HDL files such as Verilog, Abel, VHDL, and AHDL files from the module information entered by a user. In one example, the generator program identifies a portion of a high-level language program to accelerate. The other code is left for execution on a processor core. According to various embodiments, the generator program 705 identifies pointers and provides ports for each pointer. The generator program 705 also provides information to a synthesis tool 707 to allow HDL files to be automatically synthesized. In some examples, a logic description is provided directly by a designer. Hookups between various components selected by a user are also interconnected by a generator program. Some of the available synthesis tools are Leonardo Spectrum, available from Mentor Graphics Corporation of Wilsonville, Oreg. and Synplify available from Synplicity Corporation of Sunnyvale, Calif. The HDL files may contain technology specific code readable only by a synthesis tool. The HDL files at this point may also be passed to a simulation tool 709.

As will be appreciated by one of skill in the art, the input stage 701, generator program 705, and synthesis tool 707 can be separate programs. The interface between the separate programs can be a database file, a log, or simply messages transmitted between the programs. For example, instead of writing a file to storage, the input stage 701 can send messages directly to the generator program 705 to allow the generator program to create a logic description. Similarly, the generator program can provide information directly to the synthesis tool instead of writing HDL files. Similarly, input stage 701, generator program 705, and synthesis tool 707 can be integrated into a single program.

A user may select various modules and an integrated program can then take the user selections and output a logic description in the form of a synthesized netlist without intermediate files. Any mechanism for depicting the logic to be implemented on an electronic device is referred to herein as a logic description. According to various embodiments, a logic description is an HDL file such as a VHDL, Abel, AHDL, or Verilog file. A logic description may be in various stages of processing between the user selection of components and parameters to the final configuration of the device. According to other embodiments, a logic description is a synthesized netlist such as an Electronic Design Interchange Format Input File (EDF file). An EDF file is one example of a synthesized netlist file that can be output by the synthesis tool 707.

A synthesis tool 707 can take HDL files and output EDF files. Tools for synthesis allow the implementation of the logic design on an electronic device. Some of the available synthesis tools are Leonardo Spectrum, available from Mentor Graphics Corporation of Wilsonville, Oreg. and Synplify available from Synplicity Corporation of Sunnyvale, Calif. Various synthesized netlist formats will be appreciated by one of skill in the art.

A verification stage 713 typically follows the synthesis stage 707. The verification stage checks the accuracy of the design to ensure that an intermediate or final design realizes the expected requirements. A verification stage typically includes simulation tools and timing analysis tools. Tools for simulation allow the application of inputs and the observation of outputs without having to implement a physical device. Simulation tools provide designers with cost effective and efficient mechanisms for both functional and timing verification of a design. Functional verification involves the circuit's logical operation independent of timing considerations. Parameters such as gate delays are disregarded.

Timing verification involves the analysis of the design's operation with timing delays. Setup, hold, and other timing requirements for sequential devices such as flip-flops are confirmed. Some available simulation tools include Synopsys VCS, VSS, and Scirocco, available from Synopsys Corporation of Sunnyvale, Calif. and Cadence NC-Verilog and NC-VHDL available from Cadence Design Systems of San Jose, Calif. After the verification stage 713, the synthesized netlist file can be provided to physical design tools 719 including place and route and configuration tools. A place and route tool typically locates logic cells on specific logic elements of a target hardware device and connects wires between the inputs and outputs of the various logic elements in accordance with logic required to implement an electronic design. The device can also be physically tested at 723.

For programmable logic devices, a programmable logic configuration stage can take the output of the place and route tool to program the logic device with the user selected and parameterized modules. According to various embodiments, the place and route tool and the logic configuration stage are provided in the Quartus Development Tool, available from Altera Corporation of San Jose, Calif. As will be appreciated by one of skill in the art, a variety of synthesis, place and route, and programmable logic configuration tools can be tested using various techniques of the present invention.

As noted above, different stages and programs can be integrated in a variety of manners. According to one embodiment, the input stage 701, the generator program 705, the synthesis tool 707, the verification tools 713, and physical design tools 719 are integrated into a single program. The various stages are automatically run and transparent to a user. The program can receive the user selected modules, generate a logic description depicting logic for implementing the various selected modules, and implement the electronic device. As will be appreciated by one of skill in the art, HDL files and EDF files are mere examples of a logic description. Other file formats as well as internal program representations are other examples of a logic description.

Figure 8:
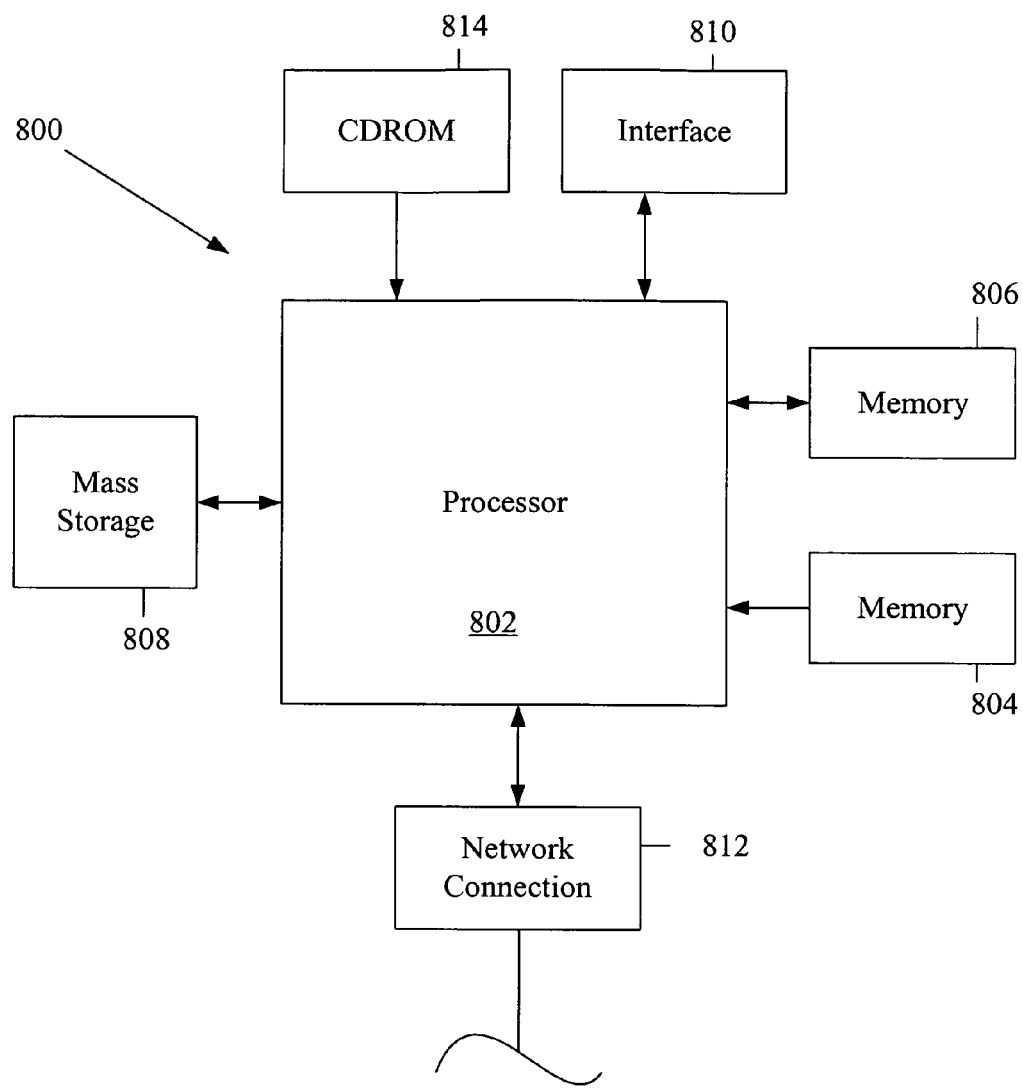
FIG. 8 is a diagrammatic representation depicting a computer system.

FIG. 8 illustrates a typical computer system that can be used to implement a programmable chip having shared I/O lines. The computer system 800 includes any number of processors 802 (also referred to as central processing units, or CPUs) that are coupled to devices including memory 806 (typically a random access memory, or "RAM"), memory 804 (typically a read only memory, or "ROM"). The processors 802 can be configured to generate a test sequences for any designated processor. As is well known in the art, memory 804 acts to transfer data and instructions uni-directionally to the CPU and memory 806 is used typically to transfer data and instructions in a bi-directional manner.

Both of these memory devices may include any suitable type of the computer-readable media described above. A mass storage device 808 is also coupled bi-directionally to CPU 802 and provides additional data storage capacity and may include any of the computer-readable media described above. The mass storage device 808 may be used to store programs, data and the like and is typically a secondary storage medium such as a hard disk that is slower than memory. The mass storage device 808 can be used to hold a library or database of prepackaged logic or intellectual property functions, as well as information on generating particular configurations. It will be appreciated that the information retained within the mass storage device 808, may, in appropriate cases, be incorporated in standard fashion as part of memory 806 as virtual memory. A specific mass storage device such as a CD-ROM 814 may also pass data uni-directionally to the CPU.

CPU 802 is also coupled to an interface 810 that includes one or more input/output devices such as such as video monitors, track balls, mice, keyboards, microphones, touch-sensitive displays, transducer card readers, magnetic or paper tape readers, tablets, styluses, voice or handwriting recognizers, or other well-known input devices such as, of course, other computers. Finally, CPU 802 optionally may be coupled to a computer or telecommunications network using a network connection as shown generally at 812. With such a network connection, it is contemplated that the CPU might receive information from the network, or might output information to the network in the course of performing the above-described method steps. It should be noted that the system 800 may also be associated with devices for transferring completed designs onto a programmable chip. The above-described devices and materials will be familiar to those of skill in the computer hardware and software arts.

The hardware elements described above may be configured (usually temporarily) to act as multiple software modules for performing the operations of this invention. For example, instructions for running a generator program, input stage (e.g., a wizard), and/or compiler may be stored on mass storage device 808 or 814 and executed on CPU 808 in conjunction with primary memory 806.

Although many of the components and processes are described above in the singular for convenience, it will be appreciated by one of skill in the art that multiple components and repeated processes can also be used to practice the techniques of the present invention.

While the invention has been particularly shown and described with reference to specific embodiments thereof, it will be understood by those skilled in the art that changes in the form and details of the disclosed embodiments may be made without departing from the spirit or scope of the invention. For example, embodiments of the present invention may be employed with a variety of primary and secondary components and should not be restricted to the ones mentioned above. It is therefore intended that the invention be interpreted to include all variations and equivalents that fall within the true spirit and scope of the present invention.

What is claimed is:

1. A method for decomposition of a circuit for implementation on a programmable chip, the method comprising:
   providing a data width, a cyclic redundancy check (CRC) width, and a polynomial associated with the CRC width;
   expressing CRC output bits as wide Exclusive OR (XOR) operations;
   performing factoring with cancellation to break the wide XOR operations into XOR operations that fit in programmable chip lookup tables (LUTs), wherein performing factoring with cancellation comprises determining a plurality of costs associated with proposed extractions.

2. The method of claim 1, further comprising performing simulated annealing to derive further logic area improvements.

3. The method of claim 2, wherein simulated annealing comprises adding and removing helper XOR gates.

4. The method of claim 2, wherein simulated annealing comprises adding and removing input signals.

5. The method of claim 1, wherein performing factoring with cancellation comprises evaluating the plurality of costs for all possible combinations of input signals up to a supported LUT size.

6. The method of claim 5, wherein cost advantage is considered only for CRC output bits that use an XOR operation wider than the supported LUT size.

7. The method of claim 6, wherein N best extractions based on the plurality of costs are tracked and executed as appropriate rather than reevaluating cost completely on each pass.

8. The method of claim 7, wherein helper gates are allocated roughly equally at each allowable level.

9. The method of claim 1, wherein the processor is further operable to provide a programmable chip specific HDL output.

10. A system for performing decomposition of a circuit for implementation on a programmable chip, the system comprising:
    an interface operable to provide a data width, a cyclic redundancy check (CRC) width, and a polynomial associated with the CRC width;
    a processor operable to express CRC output bits as wide Exclusive OR (XOR) operations and perform factoring with cancellation to break the wide XOR operations into XOR operations that fit in programmable chip lookup tables (LUTs), wherein performing factoring with cancellation comprises determining a plurality of costs associated with proposed extractions.

11. The system of claim 10, wherein the processor is further operable to perform simulated annealing to derive further logic area improvements.

12. The system of claim 11, wherein simulated annealing comprises adding and removing helper XOR gates.

13. The system of claim 11, wherein simulated annealing comprises adding and removing input signals.

14. The system of claim 10, wherein performing factoring with cancellation comprises evaluating the plurality of costs for all possible combinations of input signals up to a supported LUT size.

15. The system of claim 14, wherein cost advantage is considered only for CRC output bits that use an XOR operation wider than the supported LUT size.

16. The system of claim 15, wherein N best extractions based on the plurality of costs are tracked and executed as appropriate rather than reevaluating cost completely on each pass.

17. The system of claim 16, wherein helper gates are allocated roughly equally at each allowable level.

18. The system of claim 10, wherein the processor is further operable to provide a programmable chip specific HDL output.

19. An apparatus for decomposition of a circuit for implementation on a programmable chip, the method comprising:
    means for providing a data width, a cyclic redundancy check (CRC) width, and a polynomial associated with the CRC width;
    means for expressing CRC output bits as wide Exclusive OR (XOR) operations;
    means for performing factoring with cancellation to break the wide XOR operations into XOR operations that fit in programmable chip lookup tables (LUTs), wherein performing factoring with cancellation comprises determining a plurality of costs associated with proposed extractions.

20. The apparatus of claim 19, further comprising means for performing simulated annealing to derive further logic area improvements.

21. The apparatus of claim 20, wherein simulated annealing comprises adding and removing helper XOR gates.

22. The apparatus of claim 20, wherein simulated annealing comprises adding and removing input signals.

23. The apparatus of claim 19, wherein performing factoring with cancellation comprises evaluating the plurality of costs for all possible combinations of input signals up to a supported LUT size.

24. A computer readable storage medium having computer code embodied therein for processing by a computer, the computer readable storage medium comprising:
    computer code for providing a data width, a cyclic redundancy check (CRC) width, and a polynomial associated with the CRC width;
    computer code for expressing CRC output bits as wide Exclusive OR (XOR) operations;
    computer code for performing factoring with cancellation to break the wide XOR operations into XOR operations that fit in programmable chip lookup tables (LUTs), wherein performing factoring with cancellation comprises determining a plurality of costs associated with proposed extractions.

25. The computer readable storage medium of claim 24, further comprising computer code for performing simulated annealing to derive further logic area improvements.

26. The computer readable storage medium of claim 25, wherein simulated annealing comprises adding and removing helper XOR gates.

27. The computer readable storage medium of claim 25, wherein simulated annealing comprises adding and removing input signals.

28. The computer readable storage medium of claim 24, wherein performing factoring with cancellation comprises evaluating the plurality of costs for all possible combinations of input signals up to a supported LUT size.

* * * * *

UNITED STATES PATENT AND TRADEMARK OFFICE
CERTIFICATE OF CORRECTION

PATENT NO. : 7,634,705 B1  Page 1 of 1
APPLICATION NO. : 11/403342
DATED : December 15, 2009
INVENTOR(S) : Baeckler et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 906 days.

Signed and Sealed this

Ninth Day of November, 2010

David J. Kappos
*Director of the United States Patent and Trademark Office*